(12) United States Patent
Meagley et al.

(10) Patent No.: US 7,241,707 B2
(45) Date of Patent: Jul. 10, 2007

(54) LAYERED FILMS FORMED BY CONTROLLED PHASE SEGREGATION

(75) Inventors: Robert P. Meagley, Hilsboro, OR (US); Michael J. Leeson, Portland, OR (US); Michael D. Goodner, Hillsboro, OR (US); Bob E. Leet, Scottsdale, AZ (US); Michael L. McSwiney, Hillsboro, OR (US); Shan C. Clark, Forest Grove, OR (US)

(73) Assignee: Intel Corporation, Santa Clara, CA (US)

( * ) Notice: Subject to any disclaimer, the term of this patent is extended or adjusted under 35 U.S.C. 154(b) by 11 days.

(21) Appl. No.: 11/060,843

(22) Filed: Feb. 17, 2005

(65) Prior Publication Data

US 2006/0183348 A1     Aug. 17, 2006

(51) Int. Cl.
*H01L 21/469* (2006.01)
(52) U.S. Cl. .................. 438/789; 438/790; 438/14; 438/752; 438/753; 430/311; 430/270; 257/21.026
(58) Field of Classification Search ............... 438/789, 438/790, 752, 753, FOR. 142, FOR. 101, 438/481, 942, 948; 324/500; 257/E21.026
See application file for complete search history.

(56) References Cited

U.S. PATENT DOCUMENTS

| | | | | |
|---|---|---|---|---|
| 3,656,951 A | * | 4/1972 | Anderson et al. | 430/281.1 |
| 3,785,825 A | * | 1/1974 | Deutsch et al. | 430/165 |
| 3,984,250 A | * | 10/1976 | Holstead et al. | 430/192 |
| 4,104,070 A | * | 8/1978 | Moritz et al. | 430/329 |
| 5,474,877 A | * | 12/1995 | Suzuki | 430/325 |
| 5,932,397 A | * | 8/1999 | Mustacich | 430/321 |
| 7,037,738 B2 | * | 5/2006 | Sugiyama et al. | 438/29 |
| 2005/0227390 A1 | * | 10/2005 | Shtein et al. | 438/22 |

OTHER PUBLICATIONS

Richard A.L. Jones, Soft Condensed Matter, 2002, Oxford University Press, 72-77.*
Martin Silberberg, Chemistry: The Molecular Nature of Matter and Change, 1996, Mosby-Year Book, 593-595 623-626.*
Jerome, J., et al. "Phase Segregation of Thin Film Polymer Blends on Au Nanopatterned Si Substrates," Macromolecules 2004, 37, Jul. 29, 2004, pp. 6504-6510, American Chemical Society, published on Web.

(Continued)

*Primary Examiner*—Michelle Estrada
*Assistant Examiner*—Nicholas J. Tobergte
(74) *Attorney, Agent, or Firm*—Blakely, Sokoloff, Taylor & Zafman LLP

(57) ABSTRACT

Multiple-layer films in integrated circuit processing may be formed by the phase segregation of a single composition formed above a semiconductor substrate. The composition is then induced to phase segregate into at least a first continuous phase and a second continuous phase. The composition may be formed of two or more components that phase segregate into different continuous layers. The composition may also be a single component that breaks down upon activation into two or more components that phase segregate into different continuous layers. Phase segregation may be used to form, for example, a sacrificial light absorbing material (SLAM) and a developer resistant skin, a dielectric layer and a hard mask, a photoresist and an anti-reflective coating (ARC), a stress buffer coating and a protective layer on a substrate package, and light interference layers.

44 Claims, 18 Drawing Sheets

OTHER PUBLICATIONS

Wang, Peng, et al., "Morphology of Immiscible Polymer Blend Thin Films Prepared by Spin-Coating," Macromolecules 2004, 37, Jun. 29, 2004, pp. 5671-5681, American Chemical Society, published on Web.

"Segregation in Mixed Polymer Brushes," ALSNews vol. 215, Feb. 5, 2003, 3 pages, The Advanced Light Source/Science Web page.

Athawale, V.D., et al., "Superior Coatings with Alkyd and Ketonic Resin Blends," 18 pages, European Coatings Net: Technical Article, www.coatings.de/articles/athawale/athawale.htm.

Zhuang, Hangzhong, et al., "Physics and Astronomy: Atomic and Molecular Physics and Spectroscopy," Abstract, Technical Report, Report No. A730692, Jun. 1995, 1 page, http://www.stormingmedia.us/73/7306/A730692.html.

* cited by examiner

LAYERED FILMS FORMED BY CONTROLLED PHASE SEGREGATION

BACKGROUND OF THE INVENTION

1. Field of the Invention

The present invention relates to the field of semiconductor processing and fabrication and more particularly to the fields of photolithography, dielectric materials, and integrated circuit packaging materials.

2. Discussion of Related Art

Integrated circuits are formed of many different layers of materials. Each of these different layers is formed by a separate process during the process flow to form the integrated circuits. Employing separate processes to form each of the layers is time consuming and often complicates process flows by requiring different types of process chambers and chemistry. Additionally, the application of multiple film layers may disrupt the layers underneath. Therefore, the formation of each layer requires specific accommodations depending on whether the preexisting layers over which the new layer is to be formed can withstand the subsequent process conditions. Also, there may be adhesion problems between the layers as well as problems with controlling the thicknesses and uniformity of films. Examples of multiple layer films include the application of a spin-on hard mask over a spin-on inter-layer dielectric that requires discrete spin-on and bake steps for each of the layers. Also, the application of an organic bottom anti-reflective coating (BARC) requires a discrete spin-on and bake step before spinning-on a photoresist layer. Another example is the formation of interference layers by forming two separate layers of material having a different refractive index from one another.

In some cases, the integration of the formation of certain types of films into a process flow may be very difficult or impossible. For example, the integration of a step to form a developer resistant film above a sacrificial light absorbing material (SLAM) is difficult to accomplish as it may require additional tooling, time and complexity to, for example, add a surface cure step or to apply a discrete capping layer. SLAM is used in dual damascene and it has light absorbing properties like an anti-reflective coating (ARC) and has etching properties similar to those of the dielectric layer used in the particular dual damascene structure. In dual damascene, a first etched region (e.g. a via or a trench) within a dielectric material may be filled with SLAM. After the first etched region is filled with the SLAM, a second region is photopatterned and etched (e.g., a trench if the via is already formed or a via if the trench is already formed). It would be valuable to form a developer resistant film above a layer of SLAM because the photoresist developer etches low-k dielectric materials and SLAM. If the SLAM is attacked by the photoresist developer there may be significant undercutting of the SLAM under the photoresist, resulting in excessive etching of the dielectric layer during the dielectric etch due to the undercutting of the SLAM. Another instance where it is difficult to integrate the formation of a film into a process sequence is the formation of a protective layer over the top of a buffer coating on a package substrate. A protective coating over the top of the buffer coating would be valuable to provide additional chemical resistance to the buffer coating while maintaining valuable mechanical and optical properties.

DETAILED DESCRIPTION OF THE PRESENT INVENTION

Described herein are methods of forming multiple layer films by the phase segregation of a single film. In the following description numerous specific details are set forth. One of ordinary skill in the art, however, will appreciate that these specific details are not necessary to practice embodiments of the invention. While certain exemplary embodiments of the invention are described and shown in the accompanying drawings, it is to be understood that such embodiments are merely illustrative and not restrictive of the current invention, and that this invention is not restricted to the specific constructions and arrangements shown and described because modifications may occur to those ordinarily skilled in the art. In other instances, well known semiconductor fabrication processes, techniques, materials, equipment, etc., have not been set forth in particular detail in order to not unnecessarily obscure embodiments of the present invention.

Multiple-layer films in integrated circuit processing may be formed by the phase segregation of a single composition formed above a semiconductor substrate. The composition is then induced to phase segregate into at least a first continuous phase and a second continuous phase. The composition may be formed of two or more components that phase segregate into different continuous layers. The composition may also be a single component that breaks down upon activation into two or more components that phase segregate into different continuous layers. Phase segregation may be used to form, for example, a sacrificial light absorbing material (SLAM) and a developer resistant skin, a dielectric layer and a hard mask, a photoresist and an anti-reflective coating (ARC), a stress buffer coating and a protective layer on a substrate package, and light interference layers.

Figure 1A:
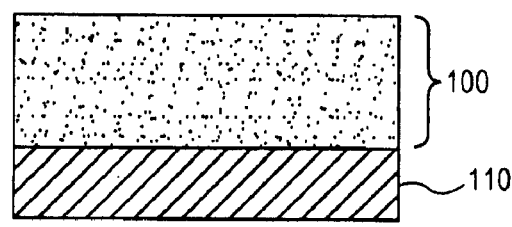
FIGS. 1a–g illustrate phase segregation within a thin film and various phase segregation profiles.

FIG. 1a illustrates a composition 100 deposited over a semiconductor substrate 110. The composition 100 deposited above a semiconductor substrate 110 may be a homogeneous mixture, an emulsion, or a suspension of lipid-like copolymers having different domains of polarity. In a homogeneous mixture, the components of the mixture are evenly distributed within a solvent. An emulsion is a suspension of small globules of one liquid component in a second liquid component with which the first liquid component will not mix. The phase segregation of the homogeneous mixture or the emulsion composition may be induced by depositing the composition 100 under a first set of conditions and then applying a second set of conditions to the composition 100. The phase segregation separates the composition into at least a first layer and a second layer.

The second set of conditions that induce the phase segregation may be the passage of time to allow the different components within the composition 100, such as an emulsion, to segregate based on different polarities. The second set of conditions may alternatively be the evaporation of a volatile phase from the composition 100, such as heating the composition 100. The second set of conditions applied to induce the phase segregation may be the irradiation of the composition 100 with light, electrons, or other charged particles, exposing the composition 100 to oxygen, polymerizing the composition 100, cross-linking the composition, isomerizing the composition, or any combination of these techniques. The modulation of the environment in which the phase segregation occurs may control the extent to which the phase segregation occurs. While inducing phase segregation, the environment may be modulated by exposing the composition to dry nitrogen, hydrogen, steam, temperature change, light, a liquid, or a supercritical fluid.

Figure 1B:
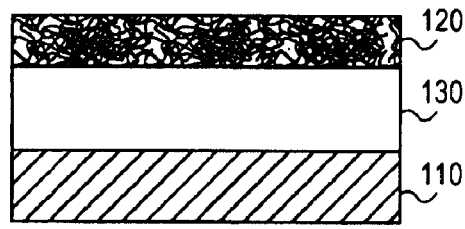
Figure 1C:
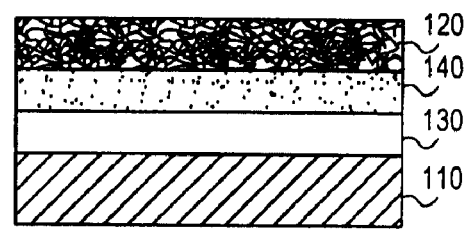
Figure 1D:
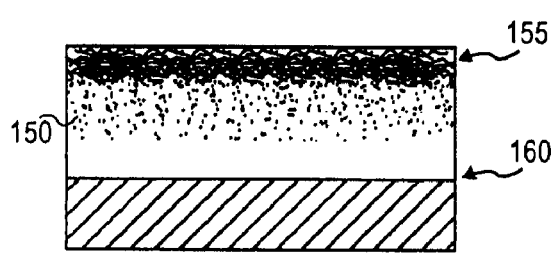
Figure 1E:
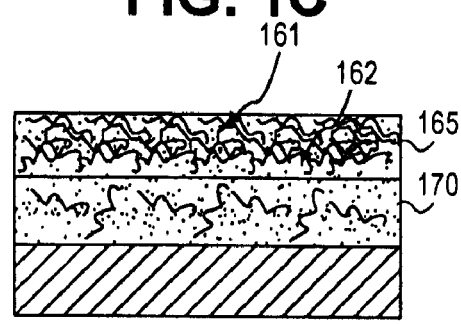
Figure 1F:

The phase segregation of the composition may form several different types of phase segregation and to different extents of segregation. Examples of the films that may be formed from the composition 100 by phase segregation are illustrated in FIGS, 1b–f. FIG. 1b illustrates the formation of two discreet films, 120 and 130. FIG. 1c is an example of the formation of three discreet films, 120, 130, and 140. The number of discreet layers may be any number depending on how many phases may be segregated from the composition 100. FIG. 1d illustrates a concentration gradient 150 where the concentrations of a first component and a second component vary as a function of depth. The concentration of the first component may be higher at the top 155 of the gradient 150 than at the bottom 160 of the gradient 150. FIG. 1e illustrates a discrete partial separation of the first component and the second component into two layers 165 and 170. In this embodiment, layer 165 is formed of the first component 161 and of a small amount of the second component 162. Layer 170 is similarly formed of the second component 162 and a small amount of the first component 161. FIG. 1f illustrates another embodiment of a concentration gradient that varies as a function of depth but where the concentration of a first component (the dark dotted portions 175) is higher at the top and the bottom of the layer, and lower towards the middle 180 where the concentration of the second component is highest.

The placement of the layers with respect to one another may be affected by several different methods. Placing one of the layers on the top or the bottom of the other may be accomplished by several different methods. These methods include taking advantage of the different densities of the respective materials so that the less dense material will end up as the top layer. Another method is to add fluorine-containing compounds to one of the materials to place that material on top at an air interface because fluorine-containing compounds have an affinity to air. In another method, one of the materials to be segregated may be placed on the bottom by adding compounds to that material that will be attracted to or chemically bond to the substrate on which the composition is deposited. These methods also act to drive the phase segregation of the composition.

Figure 1G:
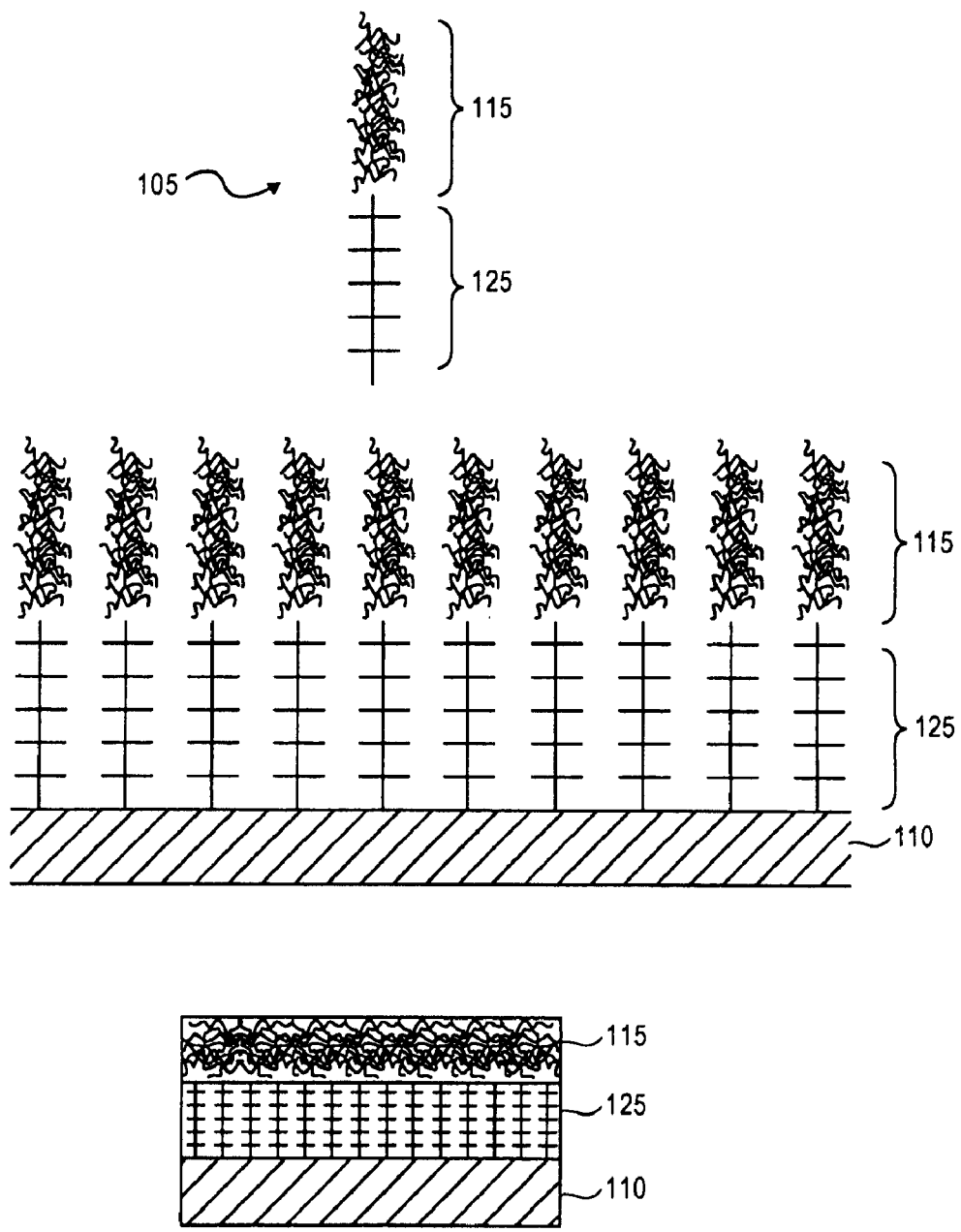

In another embodiment, illustrated in FIG. 1g, a lipid-like copolymer 105 having a first domain 115 having a first polarity and a second domain 125 having a second polarity is suspended within a solution to form the composition 100 such as that illustrated in FIG. 1a. This solution is deposited above the semiconductor substrate 110 and will line up according to the polarities of the first domain 115 and the second domain 125 to form two different layers. This is because the polarities of the co-polymers in the first domain 115 are attracted to one another and repelled by the polarity of the co-polymers in the second domain 125. Similarly, the polarities of the co-polymers in the second domain 125 are attracted to one another and repelled by the polarity of the copolymers in the first domain 115. Two phases are thus formed by the two domains, 115 and 125, of the copolymer 105.

Figure 2A:
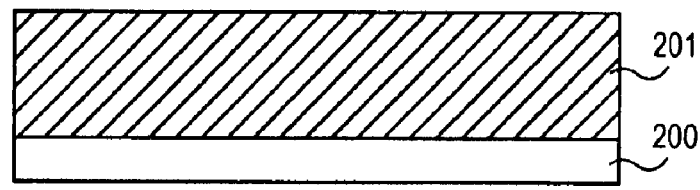
FIGS. 2a–q illustrate a dual damascene method of forming interconnect trenches and vias employing phase segregation.

The phase segregation concept may be applied to many processes in the fabrication of integrated circuits. For example, phase segregation may be used during many of the processes in a dual damascene process of forming trenches and vias. In the exemplary dual damascene process described below, a trench is formed over a via. In an alternate embodiment, the dual damascene process may also be used to form a via over a trench. In FIG. 2a, first conductive layer 201 is formed on substrate 200. Substrate 200 may be any surface generated when making an integrated circuit upon which a conductive layer may be formed. In this particular embodiment the substrate 200 may be a semiconductor such as silicon, germanium, gallium arsenide or a semiconductor-on-insulator substrate such as silicon-on-insulator.

Figure 2B:
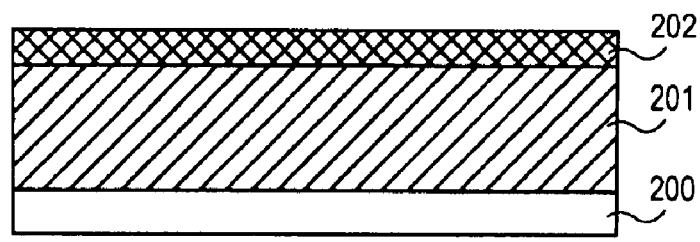
Figure 2C:
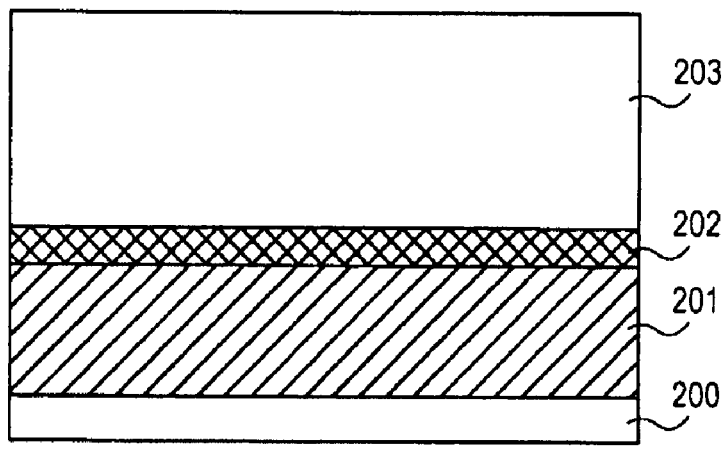

First conductive layer 201 may be made from materials conventionally used to form conductive layers for integrated circuits. For example, first conductive layer 201 may be made from copper, a copper alloy, aluminum or an aluminum alloy, such as an aluminum/copper alloy. First conductive layer 201 may be formed by electroplating, electroless deposition, chemical vapor deposition, or physical vapor deposition. The first conductive layer 201 may be formed on an underlying barrier layer or seed layer. In FIG. 2b, a barrier layer 202 that doubles as a hard mask is formed above conductive layer 201. Barrier layer 202 will serve to prevent an unacceptable amount of copper, or other metal, from diffusing into dielectric layer 203, as illustrated in FIG. 2c, and causing shorts. Barrier layer 202 also acts as a hard mask to prevent subsequent via and trench etching steps from exposing first conductive layer 201 to subsequent cleaning steps. The barrier layer 202 may be formed of a material such as silicon nitride or oxynitride.

In FIG. 2c, the dielectric layer 203 is formed on top of barrier layer 202. Dielectric layer 203 may be a material such as silicon dioxide or carbon doped oxide (CDO) or a polymeric low dielectric constant or sacrificial materials. Examples of polymeric low dielectric constant and sacrificial materials include poly(norbornene)-based sacrificial materials such as those sold under the tradename UNITY™, distributed by Promerus, LLC; polyarylene-based dielectrics such as those sold under the tradenames "SiLK™" and "GX-3™", distributed by Dow Chemical Corporation and Honeywell Corporation, respectively; and poly(aryl ether)-based materials such as that sold under the tradename "FLARE™", distributed by Honeywell Corporation. The dielectric layer 203 may have a thickness in the approximate range of 2,000 and 20,000 angstroms.

In an embodiment, the dielectric layer may be a phase-segregated layer. Using the phase segregation process, both the dielectric layer 203 and a hard mask, such as the barrier layer 202 described above, may be formed with a single deposition of a composition containing both the dielectric material and the hard mask material. In this embodiment, the composition containing a dielectric material formed of a silicon-based polymer, such as a siloxane, and a hard mask material formed of aromatic polymers such as styrene or parahydroxystyrene, is spun-on to the first conductive layer 201. The percentage of the hard mask material in the composition may be in the approximate range of 2% and 25%, and more particularly in the range of 5% and 20%. The dielectric material and the hard mask material are mixed in a solvent compatible with both types of materials to form the composition. The phase segregation in this embodiment may be affected by heating the composition to cause the evaporation of the solvent from the composition and the segregation of the dielectric material and the hard mask material into at least two different layers of the two different phases. The extent of the phase segregation is tunable and may be a complete or almost complete segregation (90% or more segregation) such as illustrated in FIG. 1b. The phase segregation may also be any of the variations described above in relation to FIGS. 1c–f. The hard mask may segregate to be formed above or below the dielectric layer, or alternatively both above and below the dielectric layer, depending on the application. Placing the hard mask on the top or the bottom of the dielectric layer may be accomplished by several methods such as those described above. The hard mask in this embodiment may have a thickness in the approximate range of 500 Å and 2500 Å, and more particularly in the approximate range of 1000 Å and 2000 Å.

In an alternate embodiment, the dielectric layer may be formed as a phase segregated layer in combination with the formation of a second phase segregated dielectric layer. A composition containing two different types of dielectric materials that may phase segregate to form at least two layers may be applied to the first conductive layer 201 by spin-coating. The composition containing these two different types of dielectric layers may be formed of the dielectric materials solvated in a compatible solvent. The two different types of dielectric materials may be dielectric materials having different dielectric constants. For example a low-k dielectric having a dielectric constant below 3.0 may be one of the phase segregated dielectric layers and dielectric having a higher dielectric constant above 3.0 but below 4.0 may be the second phase segregated dielectric layer. This may be valuable because low-k dielectric materials having a dielectric constant below 3.0 are often soft and porous and may be used in combination with harder dielectric constant materials for structural integrity of the integrated circuits. The phase segregation may be induced by heating and evaporating the solvent from the composition. The extent of the phase segregation may be engineered by any of the methods described above to form phase segregation profiles such as those illustrated in FIGS. 1b–f. The thicknesses of each of the dielectric layers may also be engineered depending on the intended application of the dielectric layers and may change as the technology advances.

In yet another embodiment, the dielectric layer may be a phase segregated layer in combination with a phase segregated photoresist compatibilizing material formed above the dielectric layer. A photoresist compatibilizing material serves to prevent poisoning of the photoresist by the dielectric material. The dielectric material may emit basic compounds such as amines into a chemically amplified photoresist that would quench the photogenerated acid that is produced during irradiation of the photoresist to form a pattern in the photoresist. The uncontrolled quenching of the photogenerated acid may significantly affect the patterning of the photoresist and the subsequent patterning of the dielectric layer. A photoresist compatibilizing formed above a dielectric prior to the deposition of a photoresist above the dielectric layer may prevent photoresist poisoning. In this embodiment, a composition containing both the dielectric material and the photoresist compatibilizing material is deposited above the first conductive layer 201 and subsequently phase segregated so that the photoresist compatibilizing material is formed above the dielectric layer. The composition contains a dielectric material such as silicon based polymers and photoresist compatibilizing materials such as oligomers or polymers with mildly acidic side chains that serve to scavenge bases from the underlying dielectric layer. The phase segregation, the extent of the phase segregation, and the placement of the photoresist compatibilizing material on top of the dielectric layer may occur by any of the methods described above. The thickness of the photoresist compatibilizing layer may be in the approximate range of 50 Å and 1000 Å.

Figure 2D:
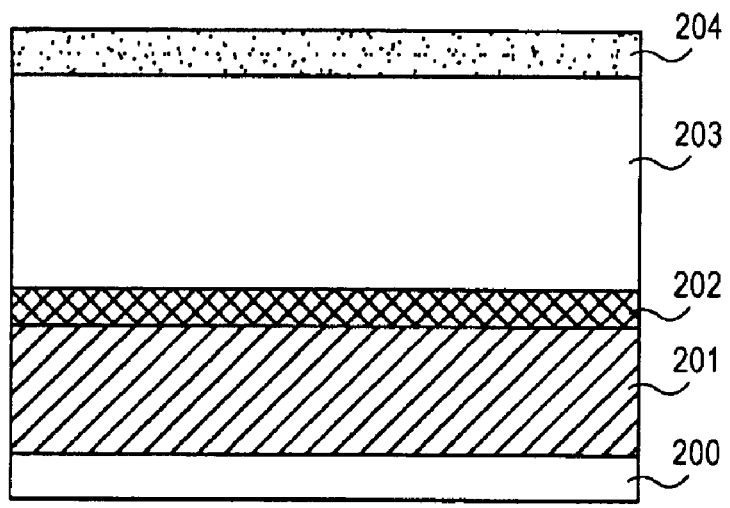
Figure 2E:
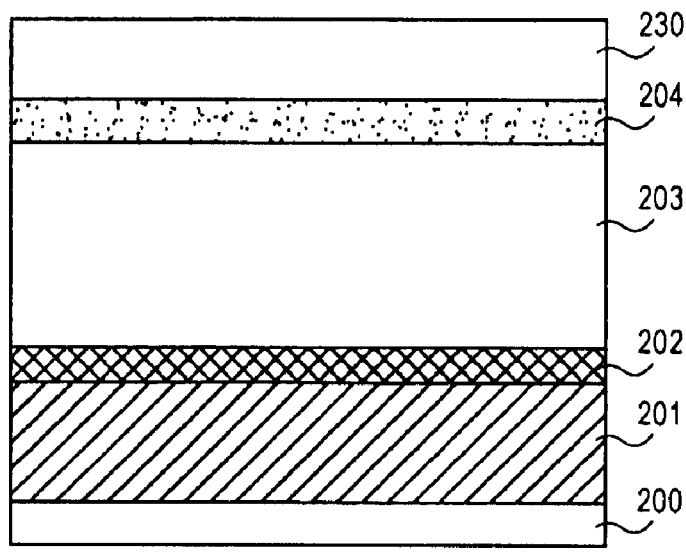

In FIG. 2d, after forming the dielectric layer 203, which may have been formed by phase segregation as described above, a bottom anti-reflective coating (BARC) 204 may be formed. The BARC 204 is formed from an anti-reflective material that includes a radiation beam altering additive and will serve to minimize or eliminate any coherent light from re-entering the first photoresist 230, that is formed over the BARC 204 in FIG. 2e, during irradiation and patterning of the first photoresist 230. The radiation beam altering additive in the BARC 204 may scatter or refract any radiation that reflects off of the material underlying the BARC 204, such as a polished dielectric material ($SiO_2$), a polished hard mask ($SiO_2$ or SiON), a semiconductor material (polysilicon), or a metal. The BARC 204 is formed of a base material and a radiation beam altering additive. The base material may be an inorganic or organic material capable of being patterned by etching or by irradiation and developing, like a photoresist.

In an embodiment, the BARC 204 may be an anti-reflective coating designed to create destructive interference. Such an "interference layer" is formed by two layers, each having a thickness of ½ the wavelength of the incident light and each having different refractive indices to destructively interfere with the incident light. These two ½ wavelength layers having different refractive indices may be formed by phase segregation. The two different layers of the destructive interference layer may be formed of polymeric materials that may be combined in solution by a solvent to form a composition that may be spin coated onto the first conductive layer 201. In one embodiment, the first destructive interference layer may be formed of a styrenic or acrylate polymer and the second destructive interference layer may be formed of a siloxane with fluorinated side groups or of a fluoropolymer. The fluorine in the second destructive interference layer would serve to segregate that layer to the top of the anti-reflective layer by the affinity of fluorine to air. Other materials may also be used to form the composition. The amount of the materials for each of the destructive interference layers is approximately 50% of the composition. In an embodiment where the polymers are solvated in a solvent, the phase segregation may be affected by heating the composition and evaporating the solvent. The layers may be segregated by any of the other methods discussed above.

In an embodiment, the BARC 204 and the photoresist 230 may be formed by phase segregation of a composition deposited above the first conductive layer 201 containing both the BARC material and the photoresist material. The photoresist material may be a polymer based material, that for EUV (extreme ultra-violet) light may be a silicon-containing polymer, and for non-EUV may be a fluorinated polymeric material. The BARC materials in the composition may be polymeric materials that are aromatic or styrenic such as anthracene or naphthalene with aromatic side groups. The BARC material also includes dyes that may be a further component of the phase segregation composition or may be sidechains to the BARC polymers. The amount of the BARC material in the composition may be in the approximate range of 2% and 25% of the composition. The BARC and photoresist polymers may be solvated in an appropriate solvent and spin coated onto the first conductive layer 201. The composition may then be phase segregated by heating to evaporate the solvent, or by any of the methods described above. The BARC may end up on the bottom of the photoresist by any of the methods described above. In one embodiment, the BARC and the photoresist may be partially segregated to form a gradient. The extent of the separation of the BARC and the photoresist may occur by applying external factors such as those described above and the profile of the segregation may be engineered to be any of those illustrated in FIGS. 1b–f. The thickness of the portion of the phase segregated material that includes the BARC may have a thickness in the approximate range of 100 Å and 500 Å and the thickness of the portion including the photoresist may be in the approximate range of 1000 Å and 2500 Å.

In other embodiments, the photoresist layer 230 may be a phase segregated layer in combination with a lower etch resistant material, a lower adhesion layer, or a lower anti-adhesion (release) layer. These phase segregated layers may be formed by the methods described above.

Figure 2F:
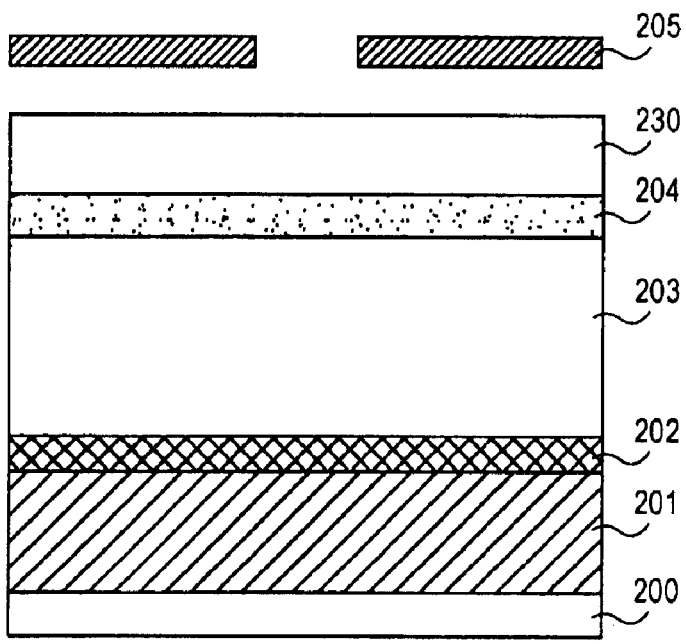

As illustrated in FIG. 2f, the first photoresist layer 230 is patterned by irradiation on top of the BARC 204 by mask 205 to define a via formation region for receiving a subsequently formed conductive layer that will contact first conductive layer 201. First photoresist layer 230 may be patterned using conventional photolithographic techniques, such as masking the layer of photoresist, exposing the masked layer to radiation, then developing the unexposed portions. The radiation may be light having a wavelength of 365 nm, 248 nm, 193 nm, 157 nm, deep ultraviolet (DUV), or extreme ultraviolet (EUV) such as 13.5 nm. The radiation may also be electron beam projection, electron beam scalpel, and ion beam lithographic technologies.

Figure 2G:
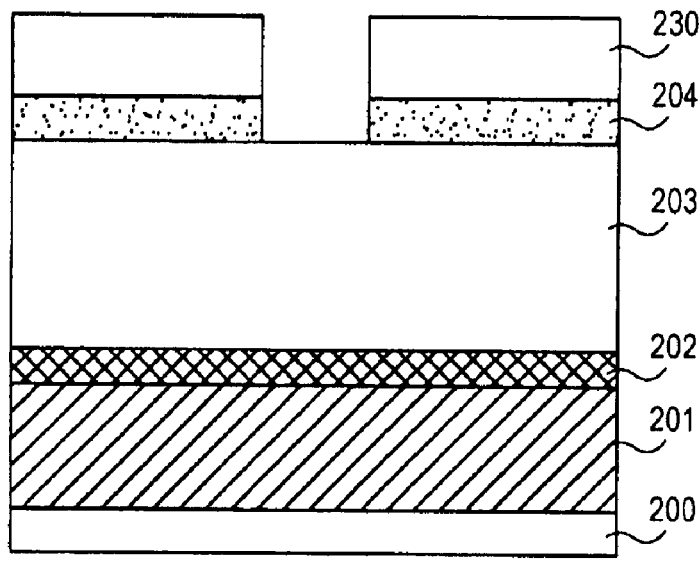

The resulting structure is illustrated in FIG. 2g. Although this particular embodiment does not specify forming a hard mask on top of the dielectric layer 203 prior to applying the first photoresist 230, such a hard mask may be valuable when using certain types of material to form dielectric layer 203, such as low-k polymer materials.

Figure 2H:
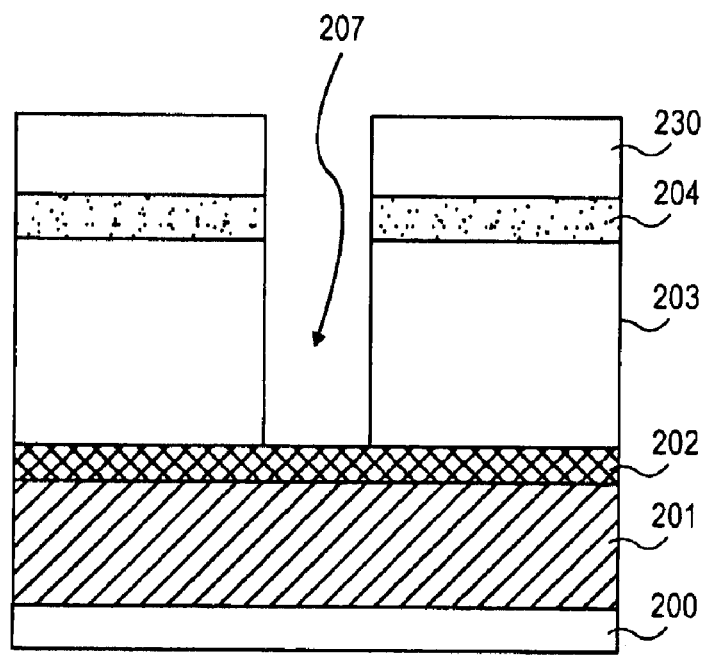

After first photoresist 230 is patterned, via 207 is etched through dielectric layer 203 down to barrier layer 202, as illustrated in FIG. 2h. Conventional process steps for etching through a dielectric layer may be used to etch the via, e.g., a conventional anisotropic dry oxide etch process. When silicon dioxide is used to form dielectric layer 203, the via may be etched using a medium density magnetically enhanced reactive ion etching system ("MERIE" system) using fluorocarbon chemistry. When a polymer is used to form dielectric layer 203, a forming gas chemistry, e.g., one including nitrogen and either hydrogen or oxygen, may be used to etch the polymer.

Figure 2I:
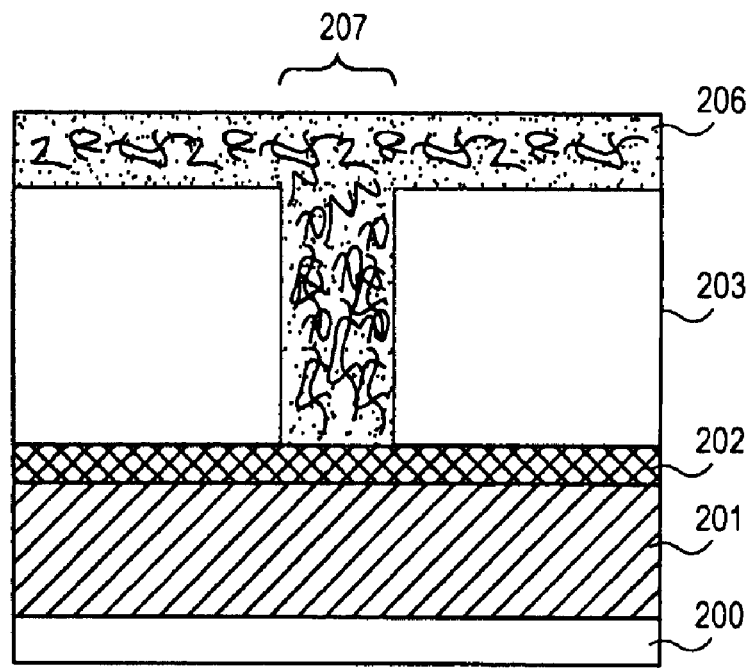

After via 207 is formed through dielectric layer 203, the first photoresist 230 and the BARC 204 are removed. Photoresist 230 and BARC 204 may be removed using a conventional ashing procedure. A sacrificial light absorbing material (SLAM) 206 is then deposited over the dielectric layer 203 as illustrated in FIG. 2i. The SLAM layer 206 is formulated to have etching properties similar to those of dielectric layer 203 to provide a clean etching profile for the trench that is etched later in the dual damascene process. In an embodiment where the dielectric layer 203 is an inorganic material such as silicon dioxide or CDO (carbon doped oxide), the base material of the SLAM layer 206 may be a spin-on-glass (SOG) such as DUO™ that is manufactured by Honeywell Corporation. In an embodiment where the dielectric layer 203 is a low-k polymer material, the base material of the SLAM layer 206 may be a spin-on-polymer (SOP) that has a polymeric backbone similar to that of the dielectric layer 203. For example, the polymeric backbone of the SOP may be poly(norbornene), polystyrene, poly(p-phenylene), polyxylene, polyimide, and polyarylene.

Figure 2J:
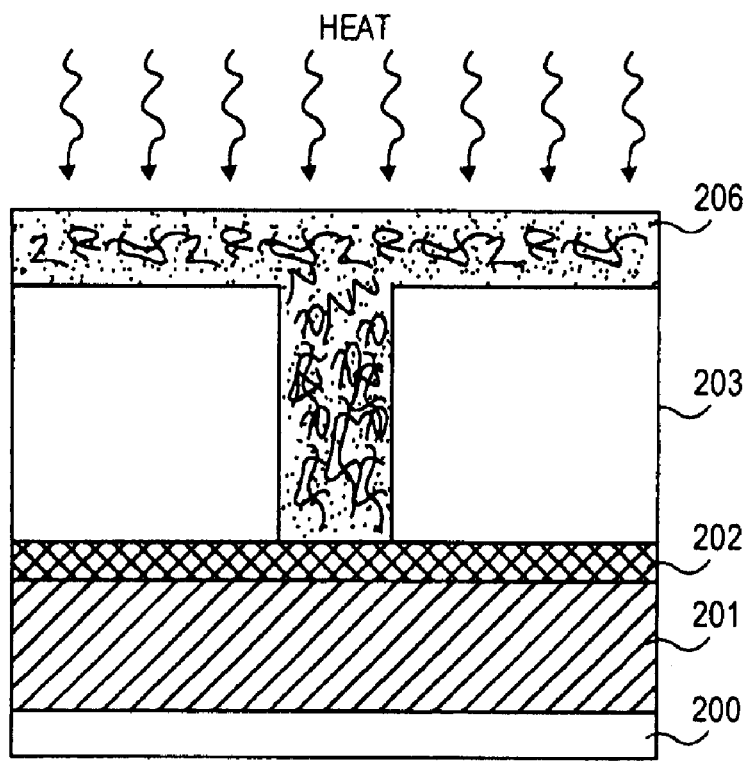
Figure 2K:
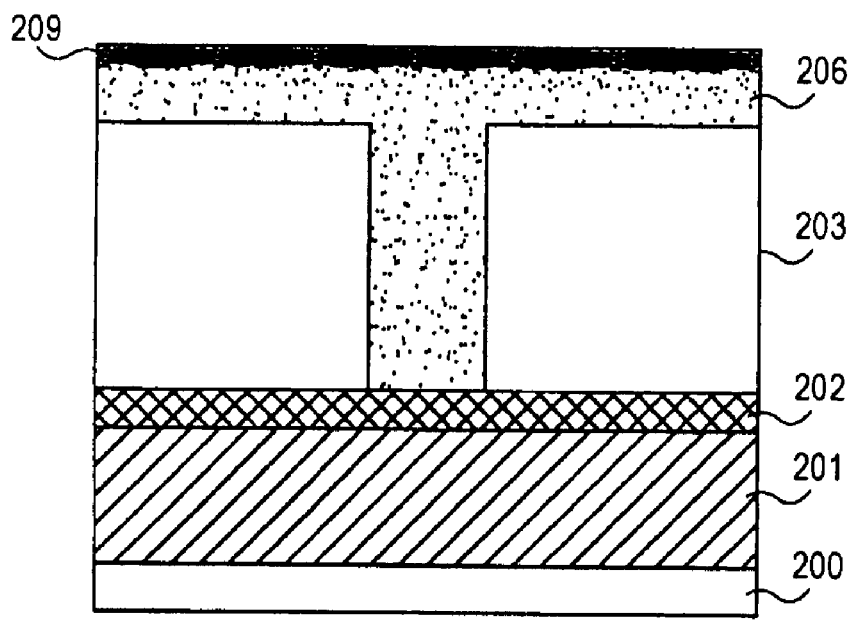

A developer resistant skin 209 may be formed above the SLAM layer 206 by phase segregation as illustrated in FIGS. 2i–2k. The developer resistant skin 209 protects the SLAM layer 206 from being etched by the photoresist developing fluid. The photoresist developing fluid may be a basic solution such as 2.38% TMAH that etches SLAM in the absence of the developer resistant skin 209. The SLAM 206 and the developer resistant skin 209 material are deposited within one composition over the via 207 and over the dielectric layer 203 to fill the via 207 as illustrated in FIG. 2i. The composition may be a SLAM material such as a spin-on-glass (SOG) that may be siloxane-based and a developer resistant skin material such as a fluorinated telomer (e.g. Teflon™). The amount of the developer resistant skin material in the composition is an amount sufficient to form a thick enough layer of the developer resistant skin to prevent the etching of the SLAM by the photoresist developing fluid. In one embodiment the amount of the developer resistant skin material in the composition may be in the approximate range of 5% and 10% of the composition and more particularly in the approximate range of 2% and 15% of the composition. The SLAM material and the developer resistant skin material may be solvated in the composition by a solvent of intermediate polarity that will solvate the materials. Examples of solvents that may be used include alcohols, ethyl lactate, and monomethylether acetate. The composition formed of the SLAM 206 and the developer resistant skin material 209 may be deposited by spin coating to fill the via 207 and to a thickness in the approximate range of 500 Å and 5000 Å above the dielectric layer 203.

Figure 2L:
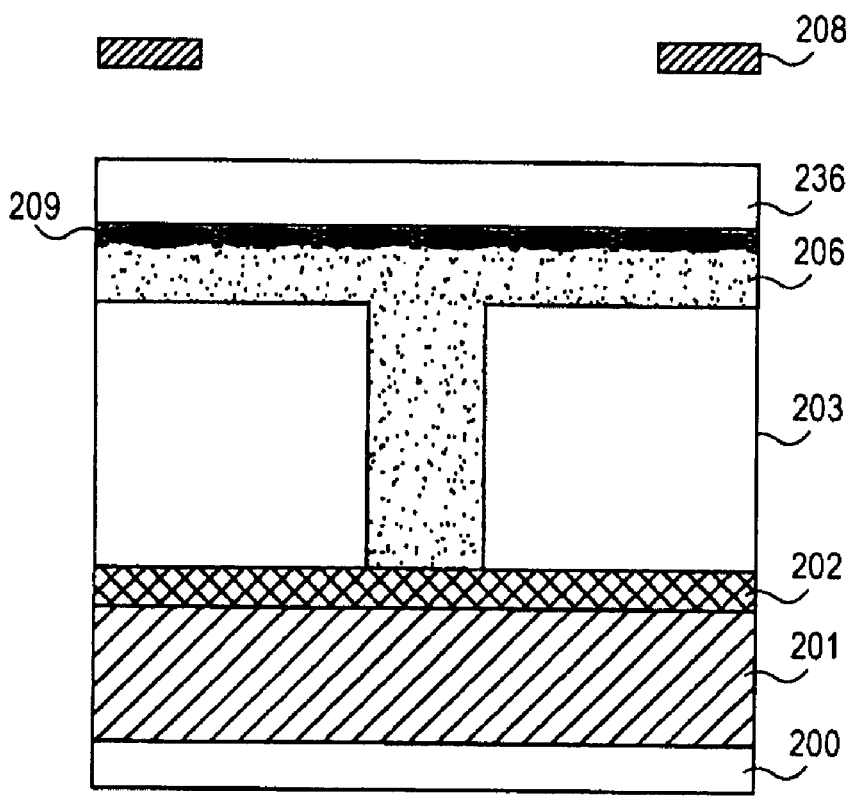

As illustrated in FIG. 2j, the phase segregation of the developer resistant skin 209 from the SLAM layer 206 may be induced by heating the composition at a temperature in the approximate range of 100° C. and 200° C. to evaporate the solvent. In other embodiments alternate methods of inducing phase segregation may be used, such as those described above. The phase segregation may be complete, or with only around 10% of the layers being a gradient. The extent of the phase segregation is tunable. Therefore, the phase segregation may be any of the profiles described above in reference to FIGS. 1b–1f. As illustrated in FIG. 2k, the developer resistant skin 209 may form on top of the SLAM layer 206 due to the fluorine content of the developer resistant skin material that has an affinity for air. The developer resistant skin 209 may also be induced to form on top of the SLAM layer 206 by any of the other methods described above. In an embodiment, the ratio of the thickness of the SLAM layer 206 to the thickness of the developer resistant skin may be 3:1–4:1. In an embodiment, the thickness of the SLAM layer 206 above the dielectric layer 203 may be in the approximate range of 3000 Å and 4000 Å and the thickness of the developer resistant skin 209 may be in the approximate range of 1000 Å and 2000 Å. The SLAM material used to form SLAM layer 206 typically contains a dye, but in an alternate embodiment, the developer resistant skin may contain a dye as well or instead of the SLAM layer 206. Furthermore, the developer resistant skin 209 may be engineered to optimize the performance of SLAM layer 206. For example, in one embodiment the developer resistant skin 209 may be engineered to match the basic pH of the second photoresist 236 formed above the developer resistant skin 209 as illustrated in FIG. 2l so that the developer resistant skin 209 is compatible with the second photoresist 236. Additionally, the SLAM layer 206 may be optimized to be compatible with the underlying dielectric layer 203. This may be done by using a SLAM material having a similar pH to the dielectric layer 203, by adding hydrophilic functional groups to the SLAM material to increase adhesion to the dielectric layer 203, or by using a SLAM material having a higher molecular weight than the underlying dielectric layer 203 so that the SLAM material won't fill the crevices of the dielectric layer 203 and will therefore be easier to remove subsequently.

Figure 2M:
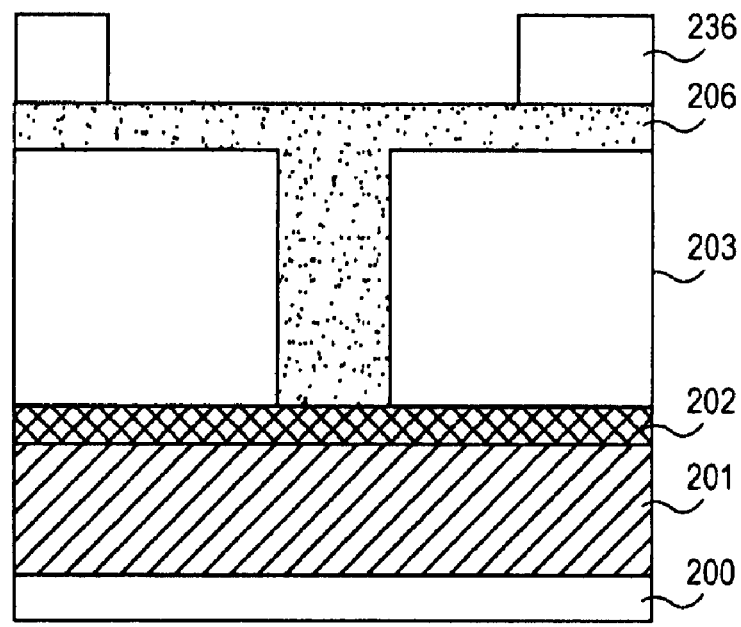

After filling via 207 with SLAM layer 206 and forming the developer resistant skin 209, a second photoresist layer 236 is applied on top of the SLAM layer 206 as illustrated in FIG. 2l. The second photoresist layer 236 is then patterned with mask 208 illustrated in FIG. 2l to define a trench formation region as illustrated in FIG. 2m. Second photoresist layer 236 may be patterned using conventional photolithographic techniques. The radiation may be light having a wavelength of 365 nm, 248 nm, 193 nm, 157 nm, deep ultraviolet (DUV), or extreme ultraviolet (EUV) such as 13.5 nm. The radiation may also be electron beam projection, electron beam scalpel, and ion beam lithographic technologies. The radiation beam altering additive included in the SLAM layer 206 improves the line roughness and CD control of the trench 210 formed by the photolithographic process described above by reducing the amount of coherent light reflected from the substrate back up into the photoresist 236. Better CD control may enable use of integrated circuit dimensions, such as in the 45 nm node and beyond, to make integrated circuits with dual damascene structures.

Figure 2N:
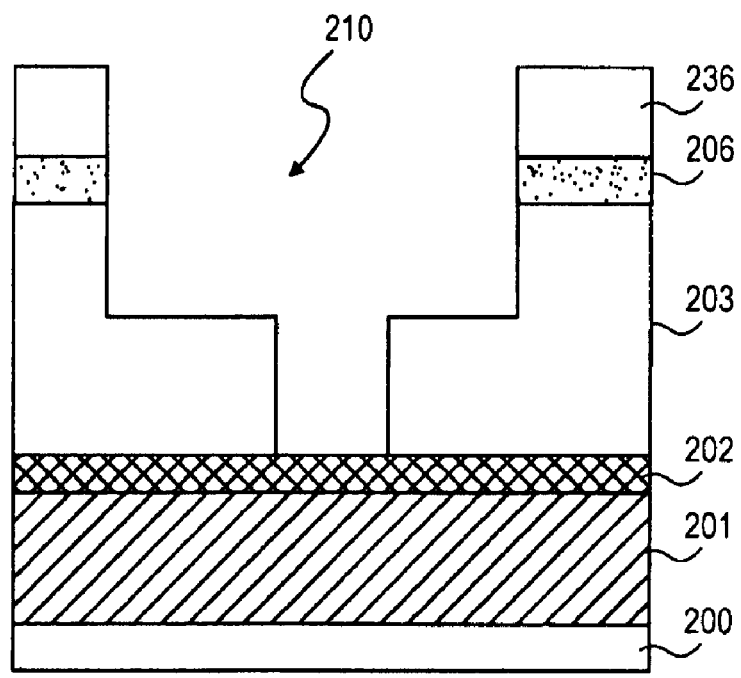

The patterned second photoresist 236, after removal of the mask 208, is illustrated in FIG. 2m. Following the photoresist patterning step, trench 210 is etched into dielectric layer 203 to form the structure illustrated in FIG. 2n. The etching process is applied for a time sufficient to form a trench having the desired depth. The etch chemistry chosen to etch trench 210 preferably should remove SLAM layer 206 at a slightly faster rate than it removes dielectric layer 203, to avoid formation of defects. Trench 210 may be etched using the same equipment and etch chemistry that had been used previously to etch via 207. As with the via etch step, barrier layer 202 may act as an etch stop during the trench etching process, protecting the underlying conductive layer 201 from the etch step, and any subsequent ashing or cleaning steps. In addition, the presence of any portion of the SLAM layer 206 that remains at the bottom of via 207 after the trench etch step may help ensure that first conductive layer 201 will not be affected by the trench etch process.

By filling via 207 with a SLAM layer 206 having dry etch characteristics like those of dielectric layer 203, the trench lithography process effectively applies to a substantially "hole-free" surface, similar to one without via 207. By selecting an appropriate SOP or SOG material for the SLAM layer 206, and an appropriate etch chemistry, trench 210 may be etched into dielectric layer 203 at a rate that is almost as fast as the SLAM layer 206 is removed. Such a process protects the underlying barrier layer 202 during the etching of the trench 210. Such a process thus permits the use of a trench etch chemistry that produces superior trench and via profiles without having to consider the effect such etch chemistry has on the selectivity between dielectric layer 203 and barrier layer 202.

Figure 2O:
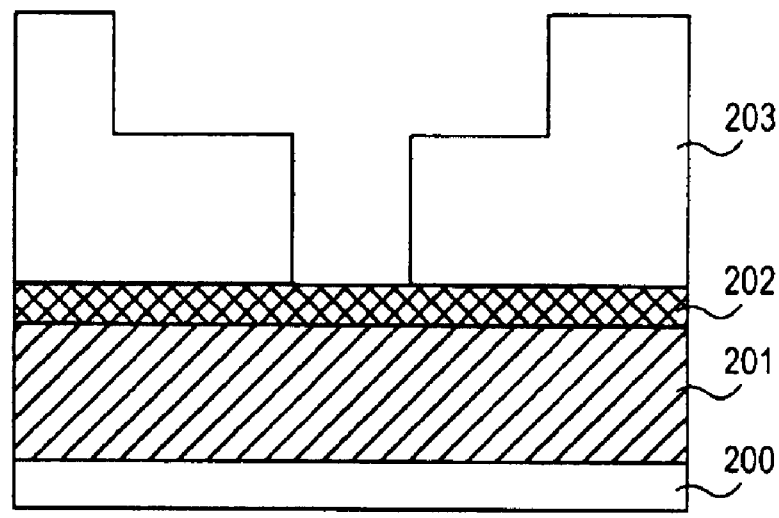

After trench 210 is etched, cleaning steps follow to remove second photoresist 236 and residues that may remain on the device's surface and inside the via 207, as illustrated in FIG. 2o. Second photoresist 236 may be removed using a conventional ashing step. Following such an ashing step, to ensure removal of remaining portions of SLAM layer 206, a wet etch step having a significantly higher selectivity for SLAM layer 206 over dielectric layer 203 should be used. When dielectric layer 203 comprises silicon dioxide and SLAM layer 206 comprises SOG, a 50:1 buffered oxide etch process should ensure that the remaining SOG material is removed at a substantially faster rate than the silicon dioxide. Alternatively, depending upon the type of SOG or SOP, and the dielectric material used, other wet etch chemistry may be used, e.g., chemistry based on commercially available amine based or amine-free materials. Irrespective of the chemistry chosen for the wet etch, there is high selectivity between the SLAM layer 206 and the dielectric layer 203.

Figure 2P:
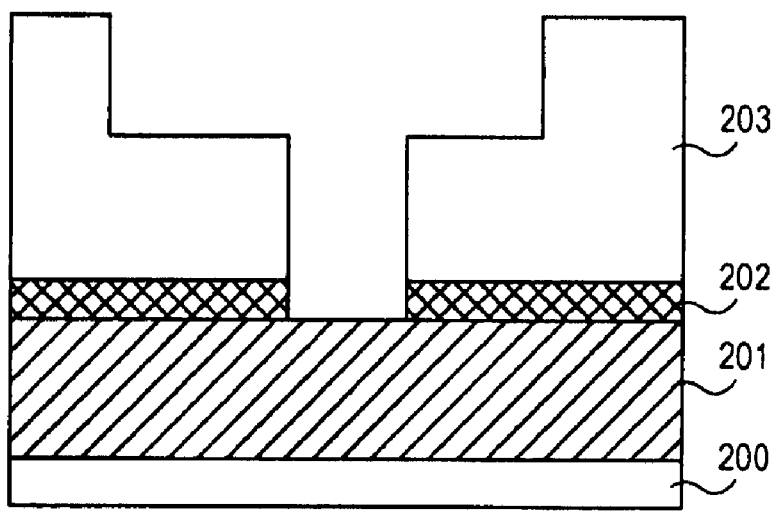

Barrier layer 202 protects conductive layer 201 from exposure to the solvents and/or oxidizing environment used when cleaning the trench 210. After the cleaning of the trench 210, the portion of the barrier layer 202 that separates via 207 from conductive layer 201 is removed to expose conductive layer 201, as illustrate in FIG. 2p. An etchant chemistry that is selective to the dielectric 203 is preferably used to remove the portion of barrier layer 202, as is well understood by those skilled in the art.

Barrier layer 202 removal may be followed by a short wet etch (that employs an etch chemistry that is compatible with the material used to form conductive layer 201) to clear etch residue from the surface of conductive layer 201. When copper is used to make the conductive layers, that portion of barrier layer 202 should be removed, using a copper compatible chemistry, before any copper electroplating step is applied to fill via 207 and trench 210. Removal of barrier layer 202 produces the structure illustrated in FIG. 2p.

Following that barrier layer removal step, trench 210 and via 207 are filled with second conductive layer 212. Second conductive layer 212 may be copper, and may be formed using a conventional copper electroplating process, in which a copper layer is formed on a barrier layer and a seed layer (not illustrated) used to line trench 210 and via 207. The copper barrier layer may comprise a refractory material, such as titanium nitride and may have a thickness in the approximate range of 100 and 500 angstroms. Suitable seed materials for the deposition of copper include copper and nickel.

As with first conductive layer 201, second conductive layer 212 may be formed from various materials that can serve to conduct electricity within an integrated circuit. When an excess amount of conductive material is used to fill trench 210 above the surface of dielectric layer 203, a chemical mechanical polishing (CMP) process may be applied to remove the excess conductive material and to planarize the surface of the second conductive layer 212. When an electroplating process is used to form the second conductive layer 212 from copper, the CMP process removes both the excess copper and the excess copper barrier layer.

Figure 2Q:
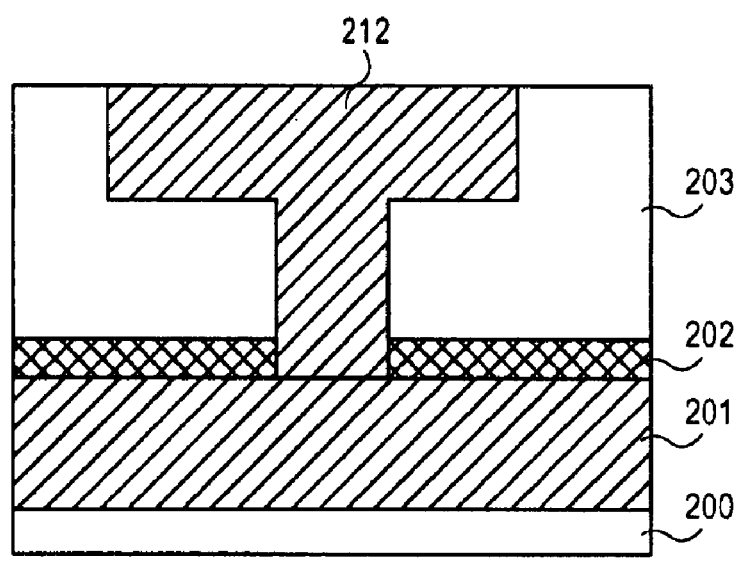

FIG. 2q illustrates the structure that results after filling trench 210 and via 207 with a conductive material, then applying a CMP step to remove excess material from the surface of layer 203 to produce second conductive layer 212. Although the embodiment illustrated in FIG. 2o illustrates only one dielectric layer 203 and two conductive layers 201 and 212, the process described above may be repeated to form additional conductive and insulating layers until the desired integrated circuit is produced.

Figure 3:
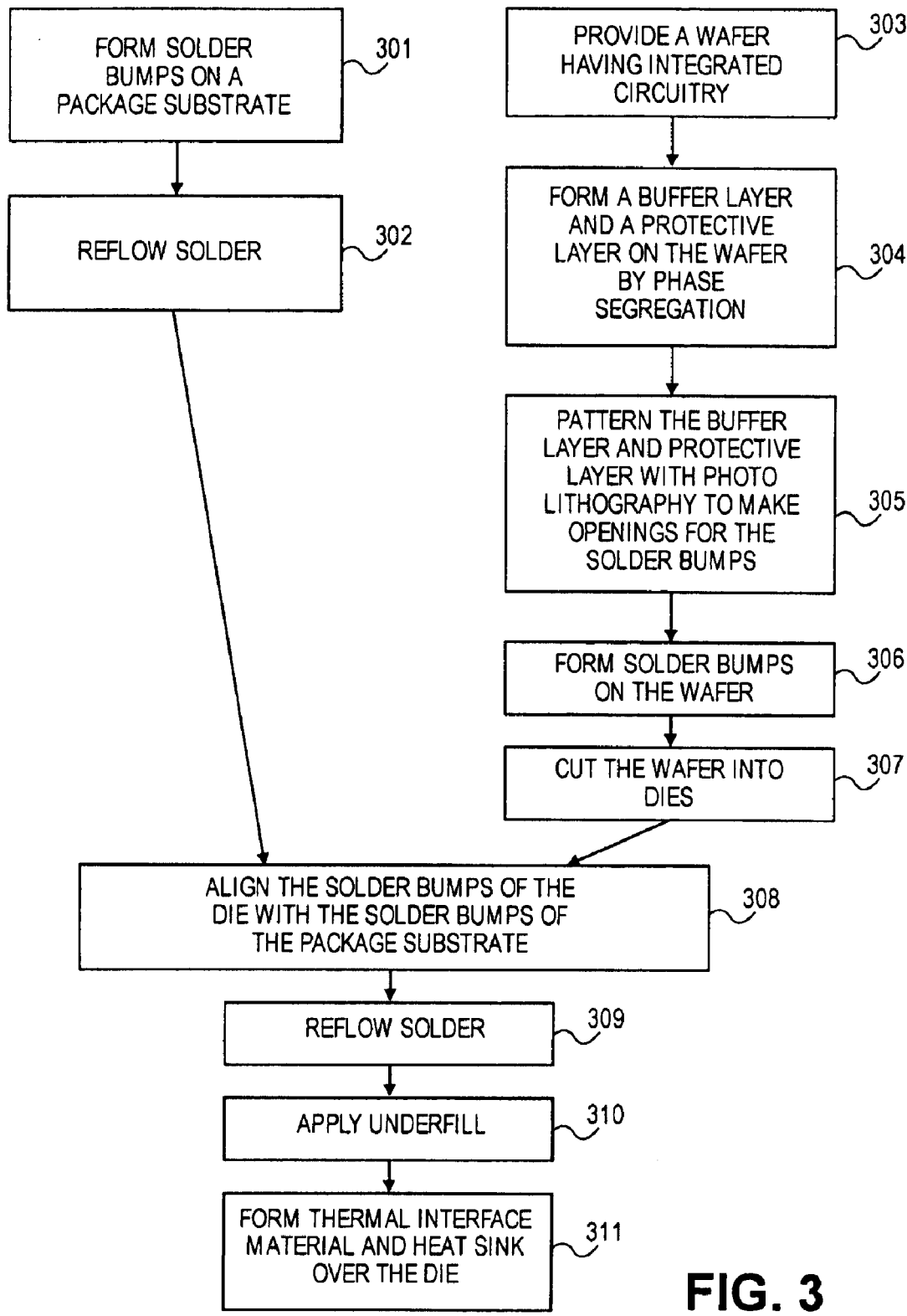
FIG. 3 is an illustration of a flow chart of a method of forming a packaged integrated circuit employing phase segregation to form a buffer layer and a protective layer on the die.

In another embodiment, the phase segregation method may be applied to the formation of a buffer layer and a protective layer over a semiconductor wafer on which the formation of an integrated circuit is complete and requires packaging to form the complete integrated circuit device. FIG. 3 illustrates a flow chart outlining the process of forming a package for a microelectronic device that includes the buffer layer and protective layer formed by phase segregation. At block 301, package solder bumps 445 are formed on a package carrier. An embodiment of this is illustrated in FIGS. 4d–4g. The package solder bumps 445 may be formed of a tin-based solder. The package carrier may be either a substrate 460 or a leadframe and will provide the connection from the die to the exterior of the package. In this particular embodiment, the package carrier is a package substrate 460. The package solder bumps 445 are typically applied to the bond pads 450 of the package substrate 460 on the top surface of the package substrate 460. After the solder is applied, the package substrate 460 is heated to beyond the solder's melting point to re-flow the package solder bumps 445, as indicated in block 302, to facilitate complete wetting of the package solder bumps 445 to the bond pads 450.

Figure 4A:
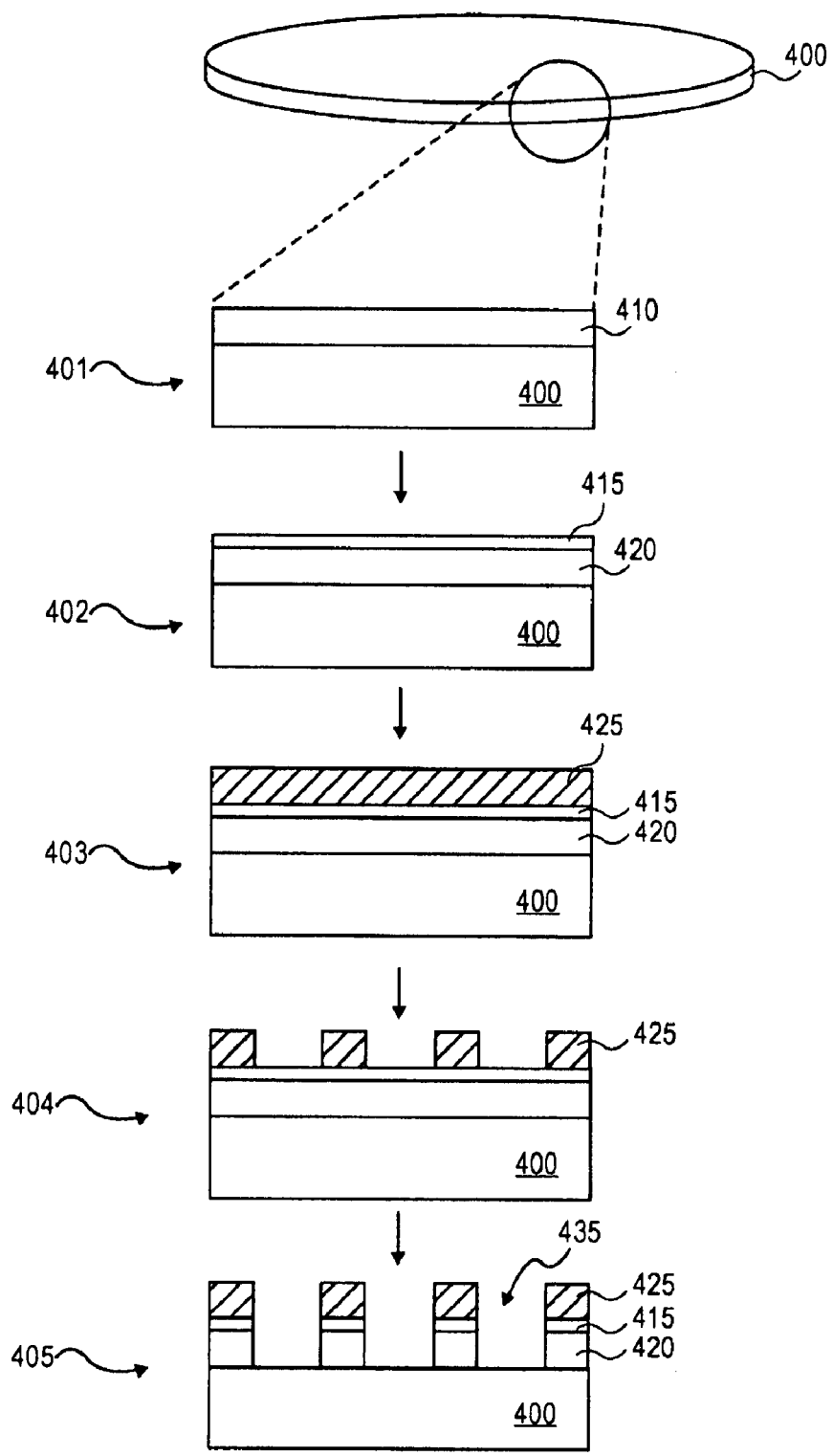
FIGS. 4a–g illustrate a method of forming a packaged integrated circuit employing phase segregation to form a buffer layer and a protective layer on the die.

At block 303 a wafer having integrated circuitry is provided. FIG. 4a illustrates a wafer 400. An expanded view of a portion of the wafer 400 is illustrated at 401–407 in both FIGS. 4a–4b to demonstrate the formation of the buffer layer and the protective layer by phase segregation and the subsequent patterning and formation of solder bumps on the wafer. At block 304 of FIG. 3, the buffer layer and the protective layer are formed on the wafer by phase segregation. These layers are formed by phase segregation by first depositing a composition 410 containing both the buffer material and the protective layer material within a solvent over the wafer 400 by spin coating as illustrated at 401. The buffer material may be a polyamide, an alicyclic addition polymer, or a polybenzoxyzole. The protective layer material may be a polyamide with different side-chains than the polyamides used for the buffer material. The side-chains on the protective layer polyamides may be fluorinated hydrocarbons or siloxanes. The side-chains serve to make the protective layer incompatible with the buffer layer material so that the two different materials will phase segregate. Also, the side-chains on the protective layer polyamides may be fluorinated to position the protective layer 415 above the buffer layer 420 due to the strong affinity that fluorinated materials have to the air. The protective layer 415 may also phase segregate above the buffer layer 420 by any of the methods described above including making the protective layer 415 of a material that is less dense than the buffer layer 420 material. The amount of the protective layer material within the composition may be in the approximate range of 5% and 50% of the composition. The solvent used to solvate the materials in the composition may be any solvent sufficient to dissolve the materials into solution, but specific examples include DMSO (dimethylsulfoxide), NMP (n-methylpyrrolidone) or xylene to solvate more polar materials and toluene for polymers having low or no polarity. The phase segregation may be effected in this embodiment by heating the composition at a temperature in the approximate range of 100° C.–200° C. to evaporate the solvent. At 402 the formation of the protective layer 415 above the buffer layer 420 after the phase segregation is illustrated. The extent of the phase segregation may be in the approximate range of 50% and 100% and more particularly in the range of 75% and 90% with some gradient formed in between the two layers to prevent peeling. The phase segregation profile may also be any of those illustrated in FIGS. 1b–1f as described above. In this embodiment, the thickness of both the protective layer 415 and the buffer layer 420 may be in the approximate range of 2 μm and 10 μm. At block 305 the buffer layer 420 and the protective layer 415 are then patterned by photolithography to make openings for the die solder bumps 430. A photoresist 425, as illustrated at 403, is then formed over the protective layer 415 to pattern openings into the protective layer 415 and the buffer layer 420 for the die solder bumps 430 to contact the integrated circuitry on the wafer 400. The photoresist 425 is then irradiated through a mask to pattern the photoresist 425 and a photoresist developer fluid is applied to the photoresist 425 to solvate the irradiated portions of the photoresist 425, as illustrated at 404. The protective layer 415 protects the underlying buffer layer 420 from the acidic chemicals in the photoresist developer fluid during the developing process. The protective layer 415 and the buffer layer 420 are then etched with an etchant to form the openings for the die solder bumps 430 as illustrated at 405. The photoresist 425 is then removed at 406 of FIG. 4b. At block 306, the die solder bumps 430 are formed on the wafer 400 within the openings 435 as illustrated at 407. The die solder bumps 430 may be formed of copper.

Figure 4B:
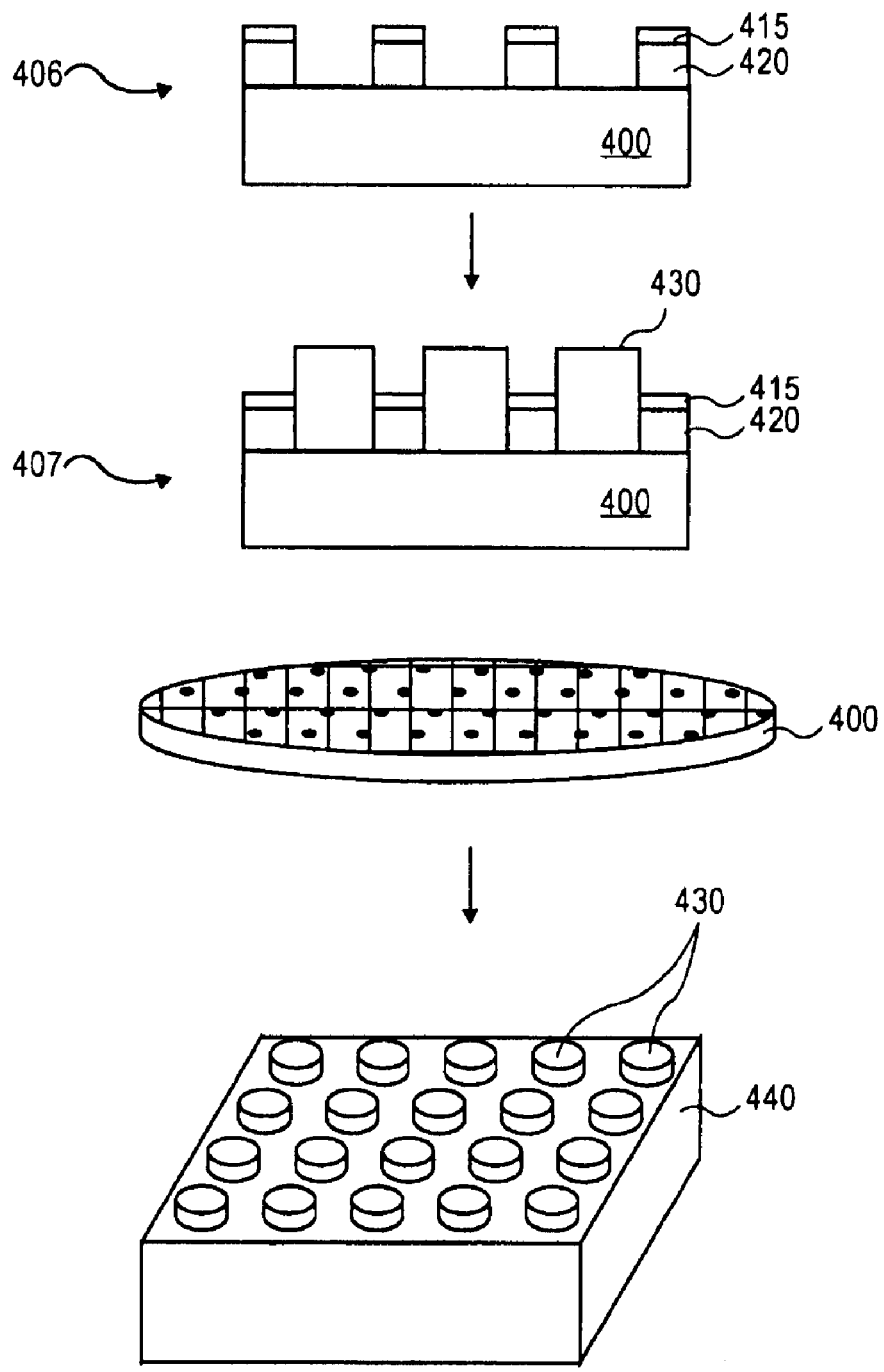
Figure 4C:
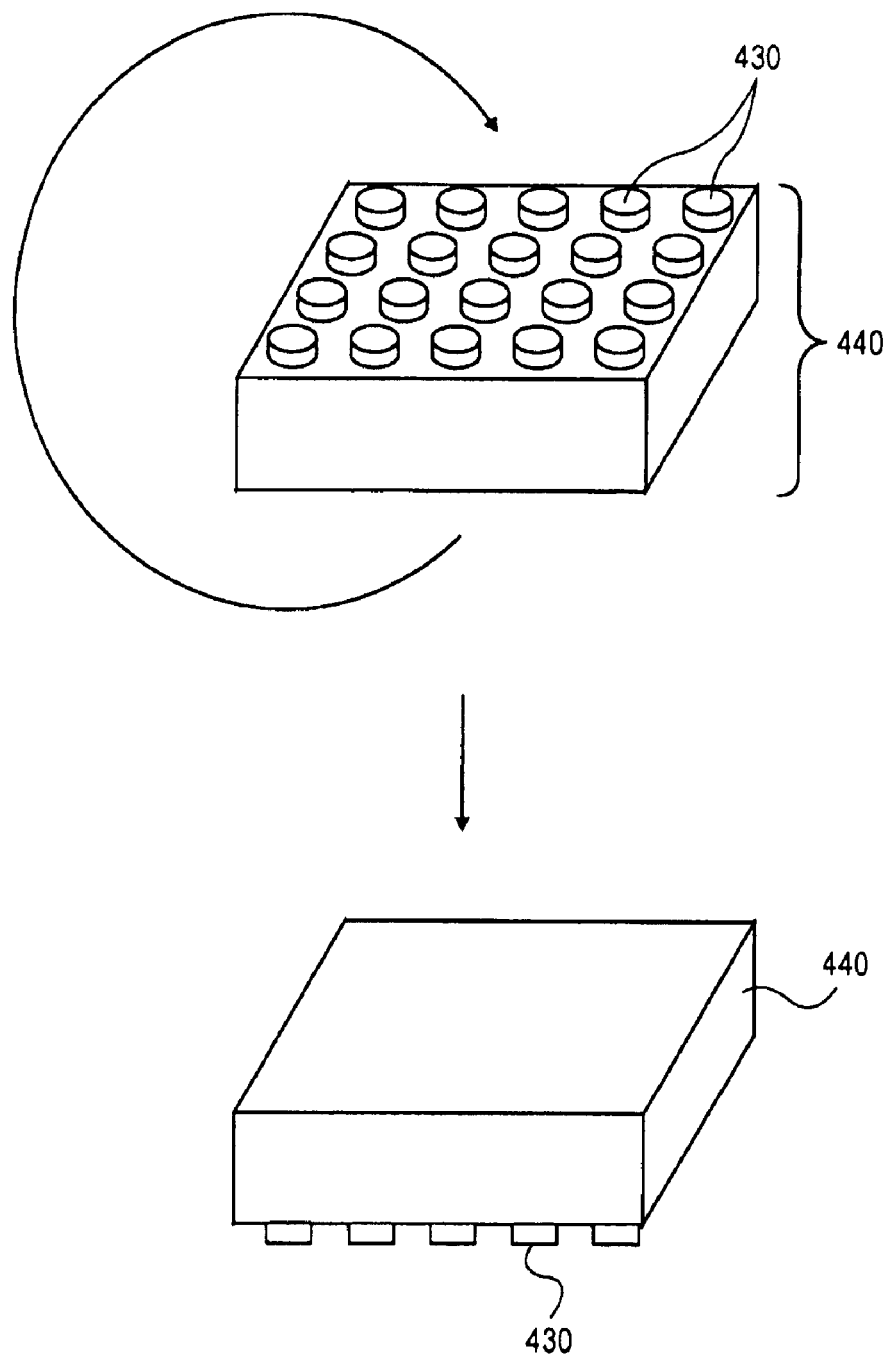
Figure 4D:
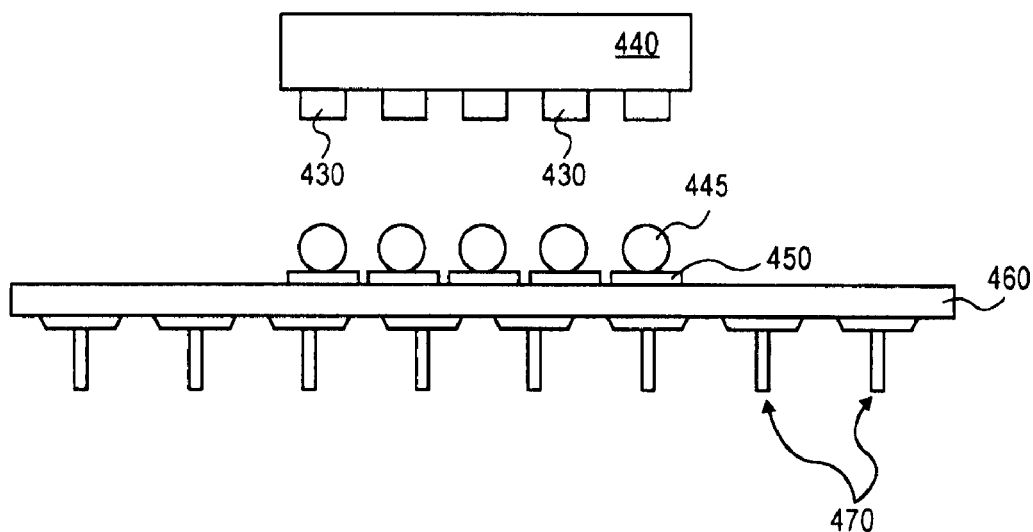
Figure 4E:
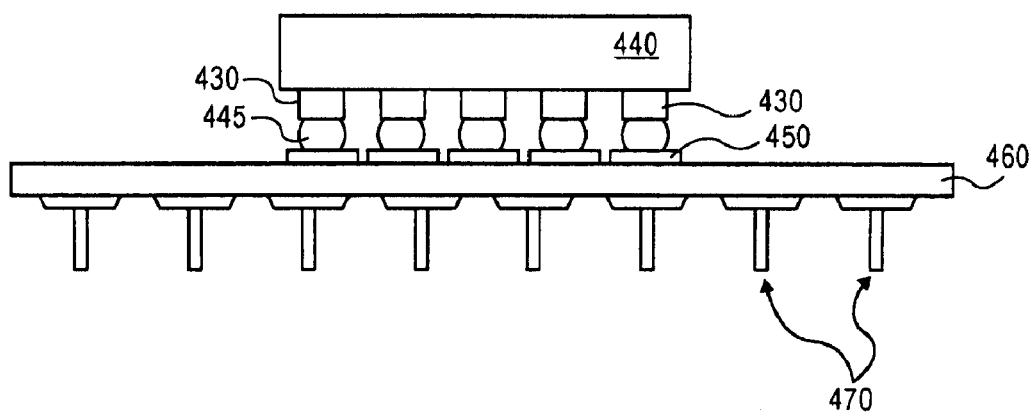
Figure 4F:
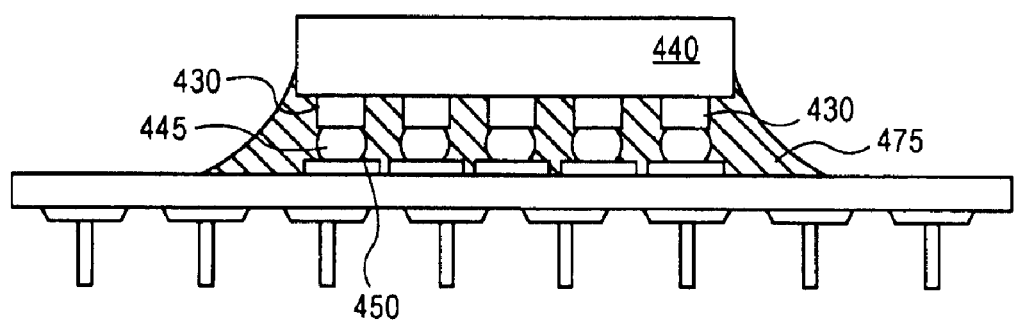
Figure 4G:
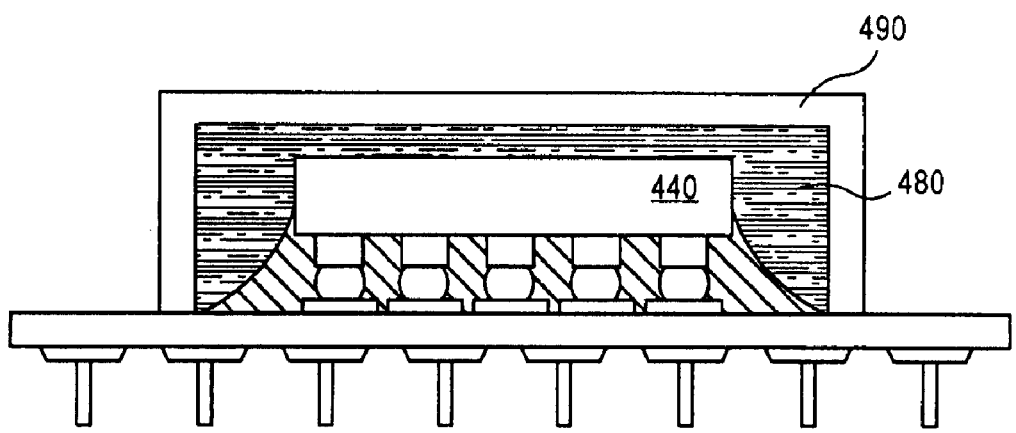

At block 307, and as illustrated in FIG. 4b, the wafer 400 is cut into dies 440 having the die solder bumps 430. In a flip-chip packaging method, the die 440 is "flipped", as illustrated in FIG. 4c, to face downwards in the direction of the upwards facing package solder bumps 445 on the package carrier to which the die solder bumps 430 are to be attached. At block 308 of FIG. 3 the die copper bumps 430 of the die 440 are aligned with the package solder bumps 445 on the pads 450 of the package substrate 460 illustrated in FIG. 4d. The package substrate 460 may be, for example, a pin grid array (PGA), as illustrated, or a ball grid array (BGA.) In the embodiment illustrated in FIGS. 4d–4g the package substrate 460 is a pin grid array with pins 470. To align the die 440 with the package solder bumps 445 on the package substrate 460, the die 440 may be picked up by the head of a thermo-compression bonder. The thermo-compression bonder is a device often used in chip packaging operations that has the capability to provide pressure to the die 440 and the package substrate 460 to hold the package solder bumps 445 in alignment with the die solder bumps 430, as illustrated at FIG. 4e. The amount of pressure applied by the thermo-compression bonder depends on the dimensions of the die and the number of flip chip connections to be made. The first solder bumps 445 are then reflowed at block 309. The package solder bumps 445 are reflowed by heating the package solder bumps 445 to above the melting point of the package solder bumps 445. The package solder bumps 445 may be heated by a pulse heat tool. The heated package solder bumps 445 are wetted to the die solder bumps 430. Once cooled, the package solder bumps 445 become attached to the die solder bumps 430 in FIG. 4e. The gap between the die 440 and the package substrate 460 may then be filled with an underfill material such as an epoxy resin 475 at block 310 of FIG. 3 to increase the longevity, environmental resistance, and fatigue strength of the interconnects as illustrated in FIG. 4f. A thermal interface material 480 and a heat sink 490 are then formed over the die 440 at block 311 and as illustrated at FIG. 4g.

Figure 5:
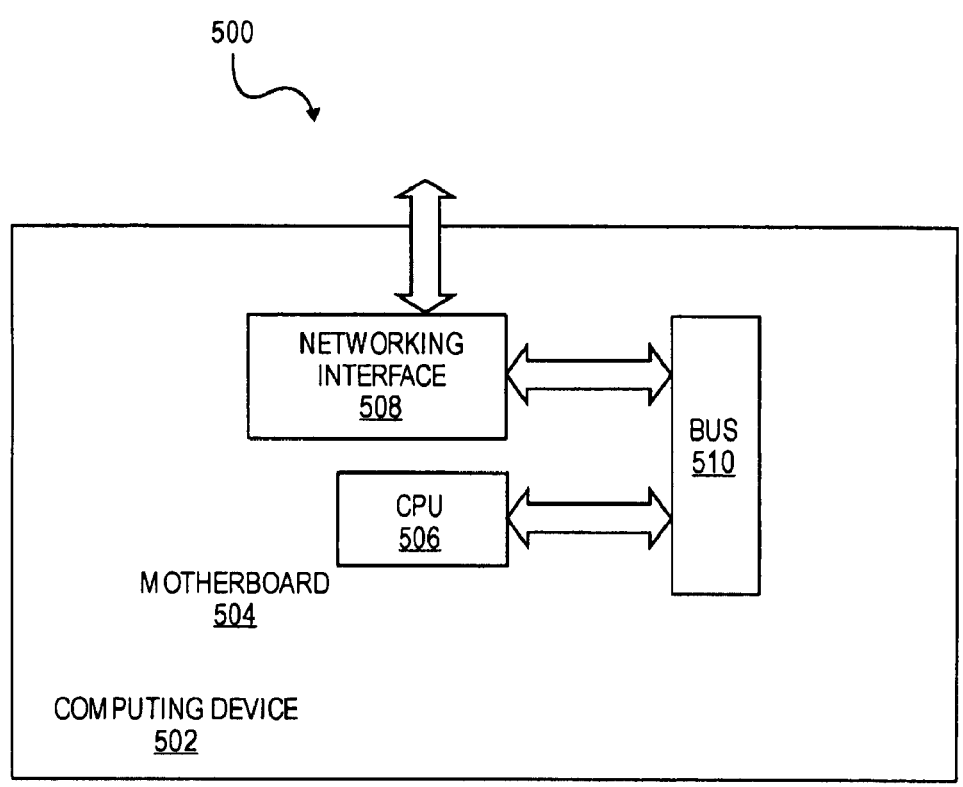
FIG. 5 illustrates a system in accordance with an embodiment of the current invention.

FIG. 5 illustrates a system 500 in accordance with one embodiment. As illustrated, for the embodiment, system 500 includes computing device 502 for processing data. Computing device 502 may include a motherboard 504. Motherboard 504 may be connected to a processor 506 and a networking interface 508 coupled to a bus 510. More specifically, processor 506 may include any of the multiple-layer films formed by the phase segregation processes described above.

Depending on the applications, system 500 may include other components, including but not limited to, volatile and non-volatile memory, a graphics processor, a digital signal processor, a crypto processor, a chipset, mass storage (such as hard disk,) compact disk (CD), digital versatile disk (DVD), and so forth. These components may be communicably connected to the die so that electrical signals may pass therebetween.

In various embodiments, system 500 may be a personal digital assistant (PDA), a mobile phone, a tablet computing device, a laptop computing device, a desktop computing device, a set-top box, an entertainment control unit, a digital camera, a digital video recorder, a CD player, a DVD player, or other digital device of the like.

Several embodiments of the invention have thus been described. However, those of ordinary skill in the art will recognize that the invention is not limited to the embodiments described, but can be practiced with modification and alteration within the scope and spirit of the appended claims that follow.

We claim:

1. A method, comprising:
   depositing a composition above a semiconductor substrate, the composition comprising at least a first component and a second component, wherein the first component comprises a sacrificial light absorbing material and the second component comprises a developer resistant material; and
   inducing phase segregation of the composition to form at least a first continuous phase and a second continuous phase, the first continuous phase comprising at least substantially the first component and the second continuous phase comprising at least substantially the second component, wherein the second continuous phase is formed above the first continuous phase.

2. The method of claim 1, wherein depositing the composition above the semiconductor substrate comprises depositing a mixture of at least the first component and the second component.

3. The method of claim 1, wherein depositing the composition above the semiconductor substrate comprises depositing the composition and activating the composition to break down into at least the first component and the second component.

4. The method of claim 1, wherein depositing the composition above the semiconductor substrate comprises depositing a suspension of bipolar co-polymers.

5. The method of claim 1, wherein depositing the composition above the semiconductor substrate comprises depositing a homogeneous composition of the first component and the second component.

6. The method of claim 1, wherein depositing the composition above the semiconductor substrate comprises depositing an emulsion of the first component and the second component.

7. The method of claim 1, wherein depositing the composition above the semiconductor substrate comprises depositing a solution comprising a first component comprising a first polarity and a second component comprising a second polarity, the second polarity different from the first polarity.

8. The method of claim 1, wherein inducing the phase segregation of the composition comprises heating the composition.

9. The method of claim 1, wherein inducing the phase segregation of the composition comprises irradiating the composition with light.

10. The method of claim 1, wherein inducing the phase segregation of the composition comprises exposing the composition to oxygen.

11. The method of claim 1, wherein inducing the phase segregation of the composition comprises evaporating a volatile phase from the composition.

12. The method of claim 1, wherein inducing the phase segregation of the composition comprises allowing an emulsion of the first component and the second component to segregate over time.

13. The method of claim 1, wherein inducing the phase segregation of the composition comprises segregating over time based on polarity differences.

14. The method of claim 1, wherein inducing the phase segregation of the composition further comprises modulating an environment in which the phase segregation occurs to control an extent of the phase segregation.

15. The method of claim 14, wherein modulating the environment in which the phase segregation occurs to control the extent of the phase segregation comprises modulating an atmosphere in which the phase segregation occurs.

16. The method of claim 14, wherein modulating the environment in which the phase segregation occurs to control the extent of the phase segregation comprises exposing the composition to dry nitrogen.

17. The method of claim 1, wherein inducing phase segregation of the composition to form at least the first continuous phase and the second continuous phase comprises a concentration gradient of the first component and the second component, wherein the concentration gradient varies as a function of depth.

18. The method of claim 1, wherein inducing phase segregation of the composition to form at least the first continuous phase and the second continuous phase comprises a discrete partial separation of the first component and the second component.

19. The method of claim 1, wherein inducing phase segregation of the composition to form at least the first continuous phase and the second continuous phase comprises a complete separation of the first component and the second component into discreet layers.

20. The method of claim 1, wherein inducing phase segregation of the composition to form at least the first continuous phase and the second continuous phase comprises applying a condition to the composition to separate the composition.

21. The method of claim 20, wherein applying the condition to the composition to separate the composition comprises heating the composition.

22. The method of claim 20, wherein applying the condition to the composition to separate the composition comprises separating the composition into the first layer comprising a sacrificial light absorbing material and the second layer comprising a developer resistant skin.

23. The method of claim 20, wherein applying the condition to the composition to separate the composition comprises separating the composition into the first layer comprising a photoresist and the second layer comprising an anti-reflective coating above the photoresist.

24. The method of claim 20, wherein applying the condition to the composition to separate the composition comprises separating the composition into the first continuous phase comprising a photoresist and the second continuous phase comprising a bottom anti-reflective coating below the photoresist.

25. The method of claim 20, wherein applying the condition to the composition to separate the composition comprises separating the composition into the first continuous phase comprising a photoresist and the second continuous phase comprising an adhesion layer below the photoresist.

26. The method of claim 20, wherein applying the condition to the composition to separate the composition comprises separating the composition into the first continuous phase comprising a photoresist and the second continuous phase comprising an anti-adhesion layer below the photoresist.

27. The method of claim 20, wherein applying the condition to the composition to separate the composition into at least the first continuous phase and the second continuous phase comprises separating the composition into the first layer comprising a dielectric material and the second layer comprising a hard mask.

28. The method of claim 20, wherein applying the condition to the composition to separate the composition into at least the first continuous phase and the second continuous phase comprises separating the composition into the first layer comprising a dielectric material and the second layer comprising a resist compatibilizing material above the dielectric layer.

29. The method of claim 20, wherein applying the condition to the composition to separate the composition into at least the first continuous phase and the second continuous phase comprises separating the composition into the first layer comprising a dielectric material and the second layer comprising a second dielectric layer.

30. The method of claim 20, wherein applying the condition to the composition to separate the composition into at least the first continuous phase and the second continuous phase comprises separating the composition into the first layer comprising a stress buffer coating and the second layer comprising a protective layer.

31. The method of claim 20, wherein applying the condition to the composition to separate the composition into at least the first continuous phase and the second continuous phase comprises separating the composition into the first continuous phase comprising a first interference layer and the second continuous phase comprising a second interference layer.

32. The method of claim 31, wherein applying the condition to the composition to separate the composition into the first interference layer and the second interference layer comprises forming the first interference layer and the second interference layer to have the same thicknesses.

33. The method of claim 32, wherein forming the first interference layer and the second interference layer to have the same thicknesses comprises forming each layer to have a thickness of ½ a wavelength of an incident light to destructively interfere with the incident light and to form an anti-reflective layer.

34. The method of claim 32, wherein forming the first interference layer and the second interference layer to have the same thicknesses comprises forming each layer to have a thickness of ¼ a wavelength of an incident light to constructively interfere with the incident light.

35. A method, comprising:
spin-coating a composition comprising mixture of a sacrificial light absorbing material and a developer resistant material onto a patterned dielectric layer; and
inducing a phase change of the composition to separate the composition into a layer of the sacrificial light absorbing material and a layer of the developer resistant material, wherein the developer resistant material is formed above the sacrificial light absorbing material.

36. The method of claim 35, wherein inducing the phase change of the composition to separate the composition into a layer of the sacrificial light absorbing material and a layer of the developer resistant material comprises evaporating a volatile phase from the composition.

37. The method of claim 36, wherein evaporating the volatile phase from the composition comprises heating the composition.

38. The method of claim 35, further comprising applying a developer solution to an irradiated photoresist formed above the developer resistant material.

39. The method of claim 35, wherein inducing the phase change of the composition to separate the composition into the layer of the sacrificial light absorbing material and the layer of the developer resistant material comprises forming a discreet layer of the sacrificial light absorbing material and a discreet layer of the developer resistant material.

40. The method of claim 35, wherein inducing the phase change of the composition to separate the composition into the layer of the sacrificial light absorbing material and the layer of the developer resistant material comprises forming a gradient of the sacrificial light absorbing material and the developer resistant material between the layer of the sacrificial light absorbing material and the layer of the developer resistant material.

41. A method, comprising:
depositing a composition above a semiconductor substrate, the composition comprising a mixture of at least a first component and a second component wherein the first component comprises a sacrificial light absorbing material and the second component comprises a developer resistant material; and
inducing phase segregation of the composition to form at least a first layer and a discreet second layer, the first layer comprising at least substantially the first component and the second layer comprising at least substantially the second component, wherein the second layer is formed above the first layer.

42. The method of claim 41, wherein depositing the composition above the semiconductor substrate comprises spin-coating the composition onto the semiconductor substrate.

43. The method of claim 41, wherein inducing the phase segregation of the composition comprises heating the composition.

44. The method of claim 41, wherein inducing the phase segregation of the composition further comprises modulating an environment in which the phase segregation occurs to control an extent of the phase segregation.

* * * * *